(12) United States Patent
Ovshinsky et al.

(10) Patent No.: US 6,963,893 B2
(45) Date of Patent: Nov. 8, 2005

(54) METHODS OF FACTORING AND MODULAR ARITHMETIC

(75) Inventors: Stanford R. Ovshinsky, Bloomfield Hills, MI (US); Boil Pashmakov, Boil, MI (US)

(73) Assignee: Energy Conversion Devices, Inc., Rochester Hills, MI (US)

( * ) Notice: Subject to any disclaimer, the term of this patent is extended or adjusted under 35 U.S.C. 154(b) by 110 days.

(21) Appl. No.: 10/726,985

(22) Filed: Dec. 3, 2003

(65) Prior Publication Data

US 2004/0078415 A1 Apr. 22, 2004

Related U.S. Application Data

(60) Division of application No. 10/155,527, filed on May 24, 2002, now Pat. No. 6,714,954, which is a continuation-in-part of application No. 10/144,319, filed on May 10, 2002, now Pat. No. 6,671,710.

(51) Int. Cl.[7] ................................................. G06F 7/50
(52) U.S. Cl. ....................................... 708/491; 708/670
(58) Field of Search ................................ 708/491, 670; 257/2

(56) References Cited

U.S. PATENT DOCUMENTS 5,825,046 A * 10/1998 Czubatyj et al. ............... 257/2
5,912,839 A * 6/1999 Ovshinsky et al. ..... 365/185.03
6,141,241 A * 10/2000 Ovshinsky et al. ......... 365/163
6,448,576 B1 * 9/2002 Davis et al. ................. 257/50

* cited by examiner

Primary Examiner—Chuong D Ngo
(74) Attorney, Agent, or Firm—Kevin L. Bray; Marvin S. Siskind

(57) ABSTRACT

A method of factoring numbers in a non-binary computation scheme and more particularly, a method of factoring numbers utilizing a digital multistate phase change material. The method includes providing energy in an amount characteristic of the number to be factored to a phase change material programmed according to a potential factor of the number. The programming strategy provides for the setting of the phase change material once for each time a multiple of a potential factor is present in the number to be factored. By counting the number of multiples and assessing the state of the phase change material upon execution of the method, a determination of whether a potential factor is indeed a factor may be made. A given volume of phase change material may be reprogrammed for different factors or separate volumes of phase change material may be employed for different factors. Parallel factorization over several potential factors may be achieved by combining separate volumes of phase change material programmed according to different potential factors. Methods of addition and computing congruences in a modular arithmetic system are also included.

25 Claims, 2 Drawing Sheets

METHODS OF FACTORING AND MODULAR ARITHMETIC

RELATED APPLICATION INFORMATION

The instant application is a division of U.S. application Ser. No. 10/155,527, entitled "Methods of Factoring and Modular Arithmetic", filed May 24, 2002, now U.S. Pat. No. 6,714,954, which is a continuation in part of U.S. application Ser. No. 10/144,319, filed May 10, 2002 now U.S. Pat. No. 6,671,710; the disclosures of which are hereby incorporated by reference herein.

FIELD OF THE INVENTION

The instant invention relates generally to methods of computing directed at factoring numbers and modular arithmetic. More specifically, the invention pertains to utilizing a digital multistate phase change material to perform factoring and modular arithmetic in a non-binary fashion.

BACKGROUND OF THE INVENTION

The development of the computer is commonly regarded as one of the most significant advances of the last half of the twentieth century. Computers have simplified many aspects of everyday life and have led to significant productivity gains in the economy. Recent needs in image processing and complex computing have spurned significant advances in microprocessor speed and memory storage density. Further advances and future applications of computers depend on mankind's ability to process larger amounts of information in increasingly more efficient ways.

Silicon is at the heart of today's computer. The advances in computing power and speed have largely been a consequence of better understanding the fundamental properties of silicon and harnessing those properties for practical effect. Initial progress was predicated on building basic electronic components such as transistors and diodes out of silicon and later progress followed from the development of integrated circuits. Recent advances represent a continuation of these trends and currently emphasize miniaturization and the integration of an ever larger number of microelectronic devices on a single chip. Smaller devices lead to higher memory storage densities, more highly integrated circuits and reduced interaction times between devices on the same chip.

An inherent feature of silicon based computing devices is the binary execution of mathematical operations and other data processing objectives. In binary computing, the computing medium, silicon, has two programming states available for representing and manipulating data. The two programming states are typically labeled "0" and "1" and the volume of silicon used to store a "0" or a "1" is typically referred to as a bit. Data, including numbers and letters, is converted to a series of one or more "0"'s and/or "1"'s where each "0" or "1" is stored in a separate bit. Thus, a series of bits may be programmed to store data by establishing the appropriate combination of "0"'s and "1"'s. Manipulations of data involve bit operations that modify the state of a bit according to a desired computing objective to produce an output that typically includes a series of bits that store a different combination or sequence of "0"'s and/or "1's" than was present at the outset of the manipulation.

Binary computers have proven remarkably successful for a number of computing applications such as automation, word processing and basic mathematical computations. As computing needs expand and more complex applications are envisioned, it is becoming more evident that conventional binary computing suffers from a number of limitations. Higher computing speeds and more parallel operation, for example, are predicated on an ability to continue to miniaturize silicon based microelectronic devices. Concerns over whether miniaturization efforts can continue are becoming more pronounced as many people believe that practical and fundamental limits will present increasingly insurmountable barriers to miniaturization. Complex computing situations such as those requiring adaptability, interactivity or highly parallel processing do not appear to be optimally achieved or even possible through conventional binary methods.

In order for the computer industry to expand and for the computer to become relevant to more applications and more complex computing situations, changes in the way computers function are in order.

SUMMARY OF THE INVENTION

The instant invention is generally directed at extending the range of capabilities of computers through non-binary computing methods. The instant methods are designed for a computing medium that is capable of non-binary operation. Non-binary operation may be obtained with a digital multistate phase change material capable of possessing more than two programming states. The instant computing methods permit the performance of computations with a computing medium that includes more than two programming states. Computations utilizing three, four or more programming states are achievable with the instant computing methods.

In one embodiment, a method of factorization is provided. The purpose of the method is to determine the multiplicative factors of an input number. The method includes programming a digital multistate phase change material according to a potential multiplicative factor through the establishment of a number of programming states corresponding to the potential multiplicative factor. A numerical value may be assigned to each programming state and transformations among or between different programming states correspond to mathematical manipulation of the numbers associated with the programming states. The programming states are separated in energy relative to the reset state of a phase change material and may be chosen so that the programming state associated with a potential multiplicative factor corresponds to the set state of a phase change material. Application of energy to the reset state of a phase change material in an amount characteristic of the potential multiplicative factor may thus lead to setting of the phase change material. The setting transformation is readily detected as a change in the resistance of the phase change material. By parsing energy corresponding to the number to be factored in amounts characteristic of the potential multiplicative factor, factoring may be accomplished by counting the number of setting transformations (and resetting after each setting transformation) and insuring that no remainder is present once all of the energy corresponding to the number to be factored has been provided.

In one embodiment, a given volume of phase change material may be employed to test different potential multiplicative factors by sequentially establishing programming states according to one multiplicative factor, determining whether that potential multiplicative factor is indeed a factor, and repeating for other multiplicative factors by re-establishing programming states accordingly. An inherent feature of a multistate phase change material is the ability to define and redefine programming states in such a way that different numbers of programming states are positioned at different energies between the reset state and set state. Consequently, it is possible for the set state to correspond to each of several different potential multiplicative factors.

In an alternative embodiment, separate volumes of phase change material may be used to test different multiplicative factors. In this embodiment, a distinct volume of phase change material is dedicated to each potential multiplicative factor of interest and programmed accordingly by establishing an appropriate number of programming states. In this embodiment, a large number of potential multiplicative factors may be tested by operating on the separate volumes of phase change material sequentially or in parallel. Parallel operation provides for especially efficient factoring of numbers.

The instant methods also provide for computations in the framework of modular arithmetic. These methods include methods for the computation of remainders and congruence relationships in arithmetic systems that are governed by a modulus.

DETAILED DESCRIPTION

The instant invention represents progress toward overcoming limitations of conventional binary computing devices by providing methods of computing suitable for use with a computing medium capable of operating in a non-binary fashion. It is believed by the instant inventors that non-binary computing methods provide an opportunity to enhance the functionality and extend the range of applications of computers. As discussed in the co-pending parent application U.S. Ser. No. 10/144,319, the disclosure of which is hereby incorporated by reference herein, non-binary computing is advantageous because it may provide for higher information storage densities and more parallel processing of data.

Realization of non-binary computing includes identifying a computing material that can sustain three or more programming states and developing computing methods capable of storing and processing data in a non-binary fashion. The co-pending parent application U.S. Ser. No. 10/144,319 identifies phase change materials as examples of materials that may be programmed to provide the multistate characteristics suitable for non-binary computing. A summary of some relevant attributes of phase change materials as media that provide multistate programming and computing capability is presented hereinbelow. Further details are included in the co-pending parent application U.S. Ser. No. 10/144,319.

Phase change materials suitable for non-binary operation include those phase having at least a high resistance state and a detectably distinct low resistance state. As used herein, high and low resistance states refer to physical states characterized by high and low electrical resistances, respectively, where the electrical resistances of the high and low electrical resistance states are relative to and detectably distinct from each other. Examples of such phase change materials are described in commonly assigned U.S. Pat. Nos. 5,166,758; 5,296,716; 5,524,711; 5,536,947; 5,596,522; 5,825,046; and 5,687,112; the disclosures of which are hereby incorporated by reference herein. Illustrative phase change materials are those that include one or more of the elements In, Ag, Te, Se, Ge, Sb, Bi, Pb, Sn, As, S, Si, P, O and mixtures or alloys thereof. In a preferred embodiment, the phase change material includes a chalcogen element. Especially preferred are phase change materials that include a chalcogen in combination with Ge and/or Sb. In another preferred embodiment, the phase change material includes a chalcogen and a transition metal such as Cr, Fe, Ni, Nb, Pd, Pt or mixtures and alloys thereof.

Figure 1:
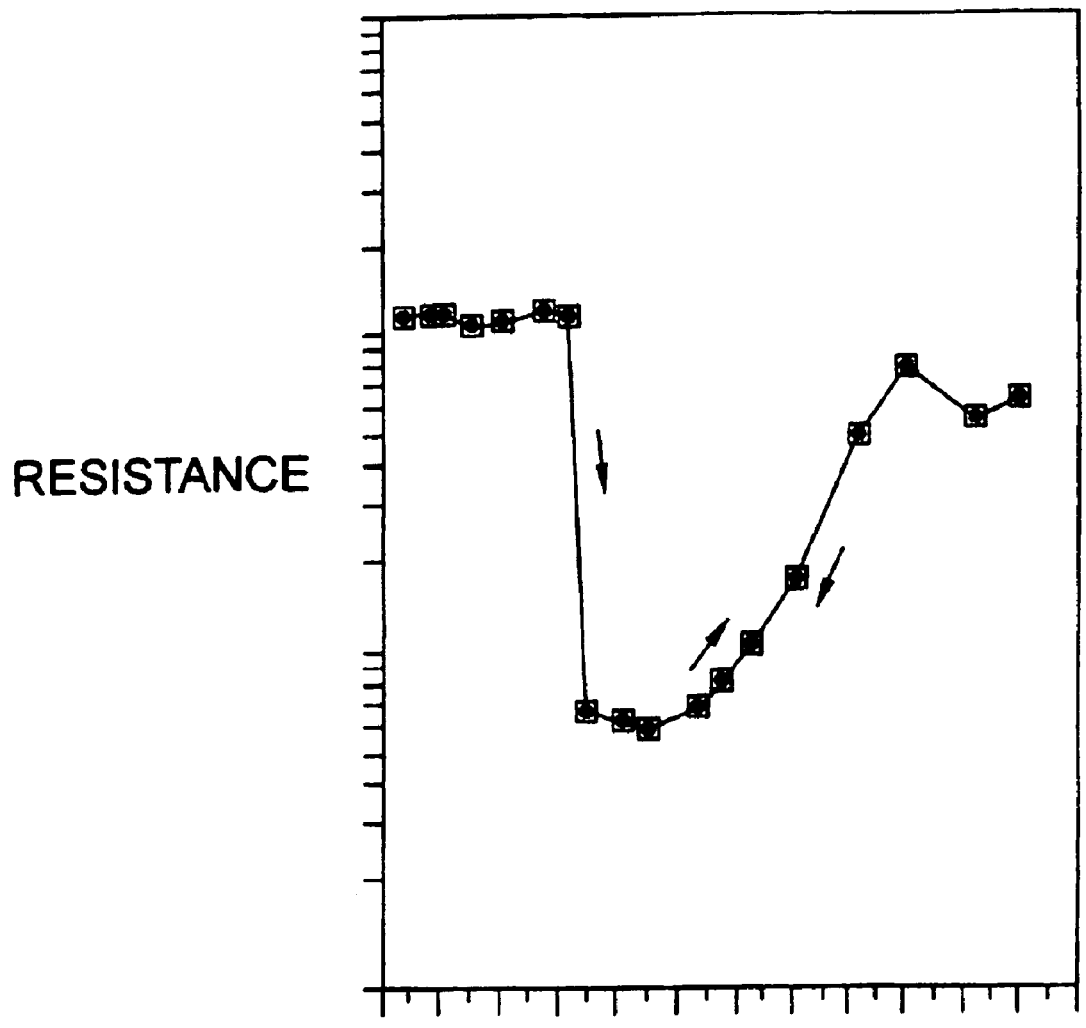
FIG. 1 is a plot of the electrical resistance of a representative phase change material as a function of the amount of energy or power provided. The plot includes a pre-setting high resistance plateau on the left and a post-setting region on the right. Representative states in both regions are shown for illustration purposes.

The phase change materials may be transformed from a high resistance state to a low resistance state upon the application of an effective amount of energy. FIG. 1 disclosed herein is a plot of the electrical resistance of a phase change material as a function of energy or power. If the phase change material is initially in its high resistance state, the application of small amounts of energy leaves the material in its high resistance state. This behavior is depicted by the high resistance plateau region shown on the left side of FIG. 1. If a sufficient amount of energy is applied, however, the phase change material transforms from its high resistance state to its low resistance state. This transformation is depicted by the steep reduction in electrical resistance immediately to the right of the high resistance plateau region of FIG. 1. This transformation of the phase change material from its high resistance state to its low resistance state is hereafter referred to as "setting" or "to set" the phase change material. The low resistance state produced upon setting is hereafter referred to as the "set state" of the phase change material. An amount of energy sufficient to set the phase change material is hereafter referred to as the "set energy" or "setting energy". Note that the set energy is different for each state along the high resistance plateau.

The right side of FIG. 1 corresponds to the behavior of the phase change material when it has been set. Once set, the phase change material is in its low resistance state and is influenced by the application of power according to the post-setting region shown in right side of FIG. 1. This portion of the electrical resistance response curve has been referred to as the analog or greyscale multibit portion of the curve in several of the U.S. Patents incorporated by reference hereinabove. The application of energy to the post-setting state of the phase change material may produce changes in its electrical resistance. The change in electrical resistance is determined by the amount of energy applied and the rate at which the energy is applied. The rate at which energy is provided is hereinafter referred to as power and is an important factor in the behavior of a phase change material in the post-setting region.

While not wishing to be bound by theory, the instant inventors believe that establishment of the low resistance set state during the setting transformation is a consequence of the formation of a contiguous crystalline pathway through the phase change material. In the pre-setting region, a phase change material is believed to include an amorphous phase component and possibly a crystalline phase component. The presence and relative abundance of the crystalline phase depends on the preparation and processing conditions used in the formation of a phase change material. Processing, for example, that includes melting followed by a rapid quench may be expected to inhibit crystallization, while melting followed by a slow quench may be expected to promote crystallization. If present in the pre-setting region, the crystalline phase is dispersed in the amorphous phase and fails to provide a contiguous pathway through the phase change material. Since the amorphous phase has a higher electrical resistance than the crystalline phase, absence of a contiguous crystalline network leads to a high electrical resistance for a phase change material in the pre-setting region.

The application of energy in the pre-setting, high resistance plateau region of the electrical resistance curve is believed by the instant inventors to increase the relative abundance of a crystalline phase within the phase change material. Provided that a contiguous crystalline network does not form, increased abundance of a crystalline phase does not substantially influence the electrical resistance of a phase change material. Formation of a contiguous crystalline network is believed by the instant inventors to occur during the setting transformation and the decrease in electrical resistance that accompanies the setting transformation is believed to result from the availability of conductive pathways through the contiguous crystalline phase. Since the contiguous crystalline phase has a lower resistance than the amorphous phase, the presence of a contiguous crystalline network leads to a lower electrical resistance for a phase change material after setting.

In the post-setting region, energy is applied to the low resistance set state and may influence the crystalline network. The addition of energy may lead to heating and an increase in the temperature of a phase change material. If sufficient energy is applied to a phase change material it may be possible to melt or otherwise thermally disrupt the contiguous crystalline network present upon setting. If melting occurs, subsequent cooling very likely leads to a phase change material having a different abundance or connectivity of a crystalline phase component. Melting or thermal disruption of the crystalline network may destroy conduction pathways through the lower resistance crystalline phase and thereby lead to an increase in the electrical resistance of a phase change material in the post-setting region. Melting or thermal disruption of a crystalline network requires that sufficient energy remain at the site of melting or thermal disruption to permit melting or thermal disruption. Since thermal dissipation processes due to thermal conductivity, heat capacity, losses to the surroundings etc. act to remove energy and thus to inhibit melting or thermal disruption of a crystalline network, the rate of energy addition must be sufficiently high to permit melting or thermal disruption while compensating for thermal dissipation processes. Hence, the rate of energy or power is an important consideration in the post-setting region of the electrical resistance curve.

Depending on the power and the state of the phase change material in the post-setting region of FIG. 1, an increase or decrease in electrical resistance may occur because the behavior in the post-setting region is reversible. This reversibility is depicted by the two arrows shown in the post-setting region of FIG. 1 and is believed by the instant inventors to reflect a reversible ability to vary the nature of the crystalline network in the phase change material. A power and electrical resistance may be associated with each point in the post-setting region. If the applied power exceeds the power associated with the point describing a phase change material in the post-setting region, the electrical resistance of the phase change material increases. Conversely, if the applied power is less than the power associated with the point describing a phase change material in the post-setting region, the electrical resistance decreases. It is believed by the instant inventors that increases in electrical resistance in the post-setting region reflect an interruption or reconfiguration of the crystalline component of a phase change material in such a way that conductive pathways through the crystalline component are reduced in number, size or capacity and vice versa for decreases in electrical resistance in the post-setting region.

The reversibility is limited to the post-setting region of FIG. 1. It is not possible to reverse the setting transformation by applying an energy corresponding to a point in the high resistance plateau region of FIG. 1 that precedes (i.e. is to the left of) the setting transformation. It is possible, however, to restore the high resistance state of the phase change material by applying a sufficiently high power to a material described by a point in the post-setting region of FIG. 1. The application of such power corresponds to moving in the rightward direction in FIG. 1, rather than in the direction of reversing the setting transformation. As shown in the post-setting region of FIG. 1, the application of continually increasing amounts power leads to a continual increase in electrical resistance. Upon application of sufficient power to drive the phase change material to the far right side of FIG. 1, the phase change material returns to its high resistance state and renews its high resistance plateau. It is believed by the instant inventors that restoration of the high resistance plateau occurs when the power provided to the phase change material is sufficient to destroy the contiguousness of any crystalline component of the phase change material. Restoration of the high resistance plateau may occur due to a reduction of the abundance of the crystalline component in the phase change material (for example, through a melting and quenching process that increases the abundance of the amorphous component), a reconfiguration or redistribution of the crystalline component in such a way that contiguousness is lost, or a combination thereof.

The power or rate of energy needed to transform a phase change material from its low resistance set state to its high resistance state is hereafter referred to as the "reset power", "resetting power", "reset energy", "resetting energy" or the like. The state of the phase change material at the conclusion of the application of the reset energy is hereafter referred to as the "reset state". The application of the reset power "resets" the phase change material to produce a high resistance reset state. The behavior observed upon further application of energy after resetting is analogous to that described for the high resistance plateau region of FIG. 1. The plot shown in FIG. 1 corresponds to one cycle of setting and resetting. The phase change material can be reproducibly set and reset over a large number of cycles.

Multiple programming states for non-binary computing may be achieved with states along the high resistance plateau region depicted in the left side of FIG. 1. The application of energy in an amount less than that needed to set, hereafter referred to as a "sub-setting amount of energy", to a phase change material in a high resistance state leads to a physical modification in the material that does not materially change its electrical resistance. The application of a sub-setting amount of energy to a phase change material described by a first point in the plateau region of FIG. 1 transforms the phase change material to a physical state described by a second point in the plateau region where the second point is to the right of the first point. It is not possible to transform a phase change material in the leftward direction in the high resistance plateau region through the application of a sub-setting amount of energy. The concept of reversibility as described hereinabove for the post-setting, analog, multibit portion of FIG. 1 does not apply to the pre-setting, digital multistate high resistance plateau. A point to the left of an initial point in the high resistance plateau region may be reached by setting the phase change material, resetting it and then applying an appropriate sub-setting amount of energy.

As a consequence of the one-directional response in the high resistance plateau region, a phase change material is able to accumulate and store energy in an amount up to the set energy of the material. Even though the electrical resistance of the phase change material does not change in the high resistance plateau region, each sub-setting application of energy causes the phase change material to predictably progress toward the low resistance set state. This behavior of the phase change material may be utilized in multistate computing methods such as those disclosed herein.

In a preferred embodiment, the reset state is selected as the starting point within the high resistance plateau region of FIG. 1. The interval of energy required to transform a phase change material from its reset state to its set state is hereafter referred to as the "setting (or set) energy of the reset state". Since the setting energy of the reset state is a property that is reproducible and constant over multiple cycles of setting and resetting, it may be divided into two or more sub-intervals and different programming states or programming values of the phase change memory material may be defined by or associated with different numbers or combinations of sub-interval energy applications. The reproducible one-directional behavior of the phase change material in the high resistance plateau region of FIG. 1 provides an ability to establish distinct programming states according to the cumulative amount of energy applied to the material in sub-interval amounts where a distinct programming state may be defined for each cumulative amount of energy that does not exceed the set energy of the reset state.

A set of distinct programming states can be uniquely and reproducibly defined according to the cumulative amount of energy applied to the reset state by a sub-setting series of sub-interval applications of energy. A first programming state, for example, may be associated with the application of a first sub-interval amount of energy to the reset state. A second application of the first sub-interval amount of energy to the phase change material in the first programming state may be used to define a second programming state. A second programming state may alternatively be associated with a single application of a second sub-interval amount of energy, which differs in magnitude from the first sub-interval amount of energy, to the reset state. Sequential applications and combinations of sub-interval amounts of energy may be used to define a series of programming states throughout the high resistance plateau region of FIG. 1 where different programming states may be distinguished according to the amount of energy relative to the reset state.

The plurality of sequences and combinations of sub-interval applications of energy constitute embodiments for establishing programming states that may be used by the instant computing methods and non-binary computing methods in general. In some embodiments, only states within the high resistance plateau region are included as programming states. In other embodiments, the set state obtained upon transformation of the phase change material to its low resistance state is included as an additional programming state. When the cumulative amount of energy applied to the reset state reaches the setting energy of the reset state, the phase change material sets. After setting, the behavior of the phase change material upon further application of energy is governed by the post-setting region of FIG. 1.

The phase change material used in the instant invention possesses a continuum of states extending from the reset state to the set state. The states include the reset state, a series of intermediate states along the high resistance plateau and the set state. The intermediate states and the set state may be obtained by applying energy to the reset state. The states associated with the phase change material may thus be viewed as forming a continuum of states distinguishable in energy relative to the reset state. The programming states described hereinabove are selected from this continuum of states. The programming states are generally associated with discrete data values, such as integers, and have programming energies corresponding to the energy that needs to be added to the reset state of the phase change material to transform the phase change material into the programming states. A particular programming state, for example, has a programming energy corresponding to the amount of energy that must be added to the reset state of the phase change material to transform it into that programming state. The programming energy of a programming state is thus a measure of energy relative to the reset state and each programming state is associated with a unique programming energy.

In a preferred embodiment, each programming state has a unique data value assigned to or associated with it. In another preferred embodiment, consecutive integers are assigned to or associated with programming states in order of increasing programming energy. In these embodiments, a number may be stored by transforming a phase change material to the programming state associated with the number. A unique correspondence of numerical values with programming states provides an ability to store any of a range of numbers in a distinct state of a phase change material. Multiple numbers or multiple digits of a particular number may be stored in multiple portions of a phase change material. Computations may generally be performed through the providing of energy to effect transformations among one or more programming states according to a computational objective.

As indicated above, each application of a sub-interval amount of energy causes a phase change material in the high resistance plateau to progress toward the set state. Even though the reset and intermediate states along the high resistance plateau have substantially the same electrical resistance and therefore cannot be distinguished on the basis of electrical resistance, each state along the high resistance plateau remains, however, detectably distinct from all others because different amounts of energy are required to set phase change materials described by different points along the high resistance plateau. If, for example, an amount of energy is applied to transform a phase change material described by a first point along the high resistance plateau to a second point along the high resistance plateau, precisely that amount of energy less is needed to transform a phase change material described by the second point to the set state than is needed to transform a phase change material described by the first point to the set state. Since the set state is a detectably distinct low resistance state relative to states along the high resistance plateau and since the amount of energy needed to set phase change materials described by any point along the high resistance plateau can be determined, different points along the high resistance plateau are distinguishable and each point along the high resistance plateau may be associated with a different programming state and/or numerical value. As a result, by dividing the energy interval from the reset state to the set state into an appropriate number of sub-intervals, virtually any number of programming states may be defined within the high resistance plateau region of FIG. 1. As a result, the high resistance plateau region may be sub-divided into a series of discrete programming states that may be used for the storage and processing of data. A phase change material is not limited to two programming states as is the case with current binary computers, but rather may provide non-binary multistate programming and computing capability.

The number of programming states depends on the magnitude of the energy interval associated with the transformation of the phase change material from its reset state (or other starting state) to its set state (the magnitude of the set energy of the reset state or starting state) as well as on the resolution with which it is possible to divide this energy interval into sub-intervals and on practical considerations such as the relative computing or processing advantage associated with having a particular number of programming states. As used herein, starting state or initial state refers to the first or lowest energy programming state along the high resistance plateau. It is preferable to let the reset state be the starting state and, unless otherwise specified, the reset state shall be presumed to be the starting state in the discussion hereinbelow. It is to be recognized however, that a different state along the high resistance plateau may be selected as the starting state.

The magnitude of the energy interval between the reset state and set state can be influenced by the chemical composition of the phase change material. The resolution with which sub-intervals may be defined depends on the energy resolution available from the energy sources that are used to program, transform or read a phase change material. The energy sources suitable for transforming a phase change material among its states according to the instant computing methods are described more fully in the co-pending parent application U.S. Ser. No. 10/144,319. From a computational standpoint, the number of programming states may influence the nature, speed, parallelness or convenience of computational methods or algorithms. Choosing the number of programming states to be a multiple of two, for example, may permit adaptation of currently available binary algorithms for use in the instant non-binary computing methods. Embodiments, for example, that include 4, 8, 16, 32, 64, etc. programming states are included in the instant invention. The use of 10 programming states permits convenient implementation of methods based on the conventional base 10 system used in everyday affairs and is also included among the embodiments of the present invention. As discussed hereinbelow, it is also desirable in the instant computing methods to utilize a phase change material having a number of programming states corresponding to potential multiplicative factors.

Examples of phase change materials suitable for use with the instant computing methods and algorithms are provided in U.S. Pat. Nos. 5,166,758; 5,296,716; 5,524,711; 5,536,947; 5,596,522; 5,825,046; 5,687,112; 5,912,839; 3,271,591 and 3,530,441, the disclosures of which are hereby incorporated by reference. The volume of memory material may comprise a mixture of a dielectric material and a phase change material. Examples of such mixtures are described in commonly assigned U.S. Pat. No. 6,087,674, the disclosure of which is hereby incorporated by reference. Materials suitable for the instant computing methods typically include one or more of the elements In, Ag, Te, Se, Ge, Sb, Bi, Pb, Sn, As, S, Si, P, O or mixtures and alloys thereof. In one preferred embodiment, the phase change material comprises a chalcogen. In another preferred embodiment, the phase change material comprises a chalcogen and Ge. In a more preferred embodiment, the phase change material comprises Ge, a chalcogen, and Sb. In a most preferred embodiment, the phase change material comprises Ge, Te and Sb.

The instant computing methods include steps involving the providing or application of energy to a phase change material. The providing or application of energy may be accomplished by any source capable of delivering a controlled amount of energy to the phase change material. The provided energy may assume many forms including electrical, optical, and/or thermal. A controlled amount of energy may also hereafter be referred to as a "pulse of energy" or "energy pulse". A "set pulse" is a pulse of energy sufficient to set a phase change material and corresponds to the providing of a setting amount of energy. A "reset pulse" is a pulse of energy sufficient to reset a phase change material and corresponds to the providing of a resetting amount of energy.

In the instant computing methods, many steps or operations are accomplished by providing energy in an amount characteristic of a number to a phase change material. The characteristic energy may depend on the setting energy of the reset state of the phase change material, the number of programming states, and the sub-interval of energy required to transform the phase change material from one programming state to the next. In one embodiment, the energy characteristic of or corresponding to a number is an amount of energy proportional to the number. The sub-interval of energy required to progress from one programming state to the next programming state is hereafter referred to as the "programming interval", "program interval", "program interval energy", "program pulse", "increment energy", "increment interval" or equivalents thereof.

As used herein, progress from one programming state to the next programming state implies transformation of a phase change material from its existing programming state to the next programming state defined along the electrical resistance curve of the phase change material. This next programming state necessarily has a higher energy than the existing programming state relative to the reset state of the phase change material and corresponds to the programming state to the right of the existing programming state along the electrical resistance curve. The terms "incrementing" or "applying increment energy" and the like refer to transforming a phase change material from an existing programming state to the programming state closest in energy and to the right of the depiction of the existing programming state on the electrical resistance curve. Incrementing thus implies a transformation of a phase change material one programming state at a time in the rightward direction along the electrical resistance curve.

In one embodiment of the instant invention, the reset state represents the number zero and a uniform increment energy is used to progress from one programming state to the next. As a result, all programming states are equally separated in energy and each application of the increment energy corresponds to increasing the value of the number stored by one. Thus, the number "1" may be stored through one application of the increment energy to the reset state; the number two may be stored through two applications of the increment energy to the reset state etc. up to the maximum number storable in the volume of memory material being used to store the number. The application of a uniform increment energy may also hereafter be referred to as a "uniform increment pulse" or other equivalent term.

Variations of the preceding embodiments in which non-uniform programming intervals or unequal increment intervals are used constitute additional embodiments of the instant invention. As used herein, non-uniform programming intervals refer to any sequence of programming intervals in which the programming states are not equally spaced in energy. In other words, the increment energy between adjacent programming states may be different at different points along the high resistance plateau so that the increment energy separating the first programming state and the second programming state, for example, may differ from the increment energy separating the second programming state and the third programming state etc. In such embodiments, the incrementing energy may not be constant, but the concept of incrementing nonetheless refers to the addition or providing of energy in an amount sufficient to transform a phase change material from one programming state to the programming state next highest in energy relative to the reset state. Equivalently, incrementing a phase change material refers to the providing of energy to a phase change material to transform it from an initial programming state to a final programming state where no programming states exist between the initial and final programming states. The initial and final programming states associated with the process of incrementing a phase change material may also herein be referred to as adjacent or consecutive programming states.

The establishment of the programming states of a phase change material is referred to herein as a programming strategy. A programming strategy includes a prescribed sequence of sub-interval applications of energy in which the program interval from one programming state to the next, as well as the cumulative applied energy from the reset state to each programming state, are specifically defined. By so doing, a collection of programming states is established where each programming state has a unique programming energy relative to the reset state. The programming strategy may be based on any combination of uniform or non-uniform program intervals extending from the reset state to the set state and may or may not include the reset state or set state as programming states. Unless otherwise specified, the discussion hereinbelow is based on a programming strategy using uniform program intervals. It is to be recognized, however, that this choice is made for the convenience of discussion and does not represent a limitation on the practice of the instant invention.

Possibly included within a programming strategy is an assignment to or association of data or numerical values with the programming states such that each programming state corresponds to a different data value or number. Computations may be effected through transformations of a phase change material among its programming states. The conversion of an input number to an output number according to a mathematical objective, for example, may be accomplished by judiciously providing energy so as to transform a phase change material from the programming state corresponding to the input number to the programming state corresponding to the output number. Preferably, the values associated with the programming states are integers. More preferably, the integers are consecutive. Embodiments in which integer values are associated in increasing as well as decreasing order of programming energy are envisioned. For example, if the reset state is associated with a data value of zero, application of one programming interval of energy places the material in a programming state associated with a data value of one, application of another programming interval of energy places the material in a programming state associated with a data value of two etc. Alternatively, it is possible to associate data values with programming states in a decreasing order of programming energy. For example, if the set state is associated with a data value of zero, the programming state to which one programming interval of energy was provided to obtain the set state would be associated with a data value of one etc. Association of data values with programming states may be completed in a variety of ways to facilitate specific computations or user preferences.

The instant computing methods are suitable for use with a non-binary computing medium. As used herein, a non-binary computing medium refers to a material having three or more programming states. Whereas a binary computing medium provides for two programming states (typically the states are labeled "0" and "1") a non-binary computing medium provides for more than two programming states. A three state non-binary computing medium may, for example, provide for states labeled "0", "1" and "2". Higher order non-binary computing media having more than three states may similarly be defined.

In order to achieve the benefits of non-binary computing, it is necessary to formulate methods of computing directed toward the multistate nature of non-binary computing media. Methods of addition, subtraction, multiplication and division have been described in the co-pending parent application U.S. Ser. No. 10/144,319. The instant methods are directed toward the factoring of numbers and to computations within the framework of modular arithmetic. One method of factoring includes determining whether a particular number is a multiplicative factor of another number. Another method of factoring includes determining a complete set of multiplicative factors of a particular number. In a preferred embodiment, the prime factors of a particular number are determined. Methods of modular arithmetic include determining remainders, computations involving remainders and classifications of numbers into residue classes.

METHODS OF FACTORING

One method of factoring includes a determination of whether a number is a multiplicative factor of another number. The method generally requires input of the number to be factored and the potential multiplicative factor and returns as output a determination of whether the potential multiplicative factor is indeed a multiplicative factor. The method includes defining a programming strategy for a phase change material in which programming states are established in accordance with a potential multiplicative factor. The establishment of programming states includes defining a number of programming states for a phase change material such that the number of increments required to traverse from the reset state to the set state is equal to the potential multiplicative factor. The programming strategy includes specification of the programming energy of each programming state where the programming energy is the energy that must be provided to the reset state of a phase change material to transform it to the programming state. Once the programming energy of each programming state is established, the increment interval between adjacent programming states is also established and the increment of energy required to transform a phase change material from one programming state to the next is known.

Once the programming strategy has been defined for a particular potential multiplicative factor, a determination may be made as to whether the potential multiplicative factor is indeed a factor of a number for which factoring is desired. This determination includes resetting the phase change material and incrementing it a number of times equal to the number for which factoring is desired. This incrementing may also be referred to herein as incrementing according to the number for which factoring is desired. When the number of increments equals the potential multiplicative factor, a phase change material sets. The set state of a phase change material has a lower electrical resistance than other states included in the programming strategy and may readily be detected through a measurement of electrical resistance. Each time a phase change material is incremented, for example, the electrical resistance may be measured to determine whether the phase change material is in its set state. In the instant method of factoring, the phase change material is reset each time it sets during incrementing according to the number for which factoring is desired. Upon conclusion of incrementing, a determination is made as to whether the potential multiplicative factor is indeed a factor. If the phase change material is in its set state upon conclusion of the incrementing according to the number for which factoring is desired, the potential multiplicative factor is indeed a factor.

Termination of the incrementing at the set state is a necessary condition for any factor as a consequence of the programming strategy employed by the method. Each occurrence of a potential multiplicative factor in the number for which factoring is desired results in a setting of the phase change material. Consequently, if the phase change material is in its set state upon conclusion of incrementing, the potential multiplicative factor is a divisor and hence a factor of the number for which factoring is desired. If a potential multiplicative factor is indeed a factor, its co-factor (i.e. the number with which is multiplied by to obtain the original number to be factored) may be determined by counting the number of times the phase change material is set during the incrementing. If the phase change material is in a state other than its set state, the potential multiplicative factor is not a factor.

The instant method of factoring provides for factoring according a plurality of potential multiplicative factors. Different multiplicative factors may be tested sequentially using a single device programmed according to different multiplicative factors. A first multiplicative factor may be tested using a first programming strategy based on it where the number of increments required to transform a phase change material from its reset state to its set state is equal to the first multiplicative factor. A second multiplicative factor may similarly be tested using a second programming strategy based on the second multiplicative factor. A computing medium comprising a phase change material provides the capability to program and reprogram a given volume of phase change material according to different multiplicative factors by defining and redefining programming states. The number of programming states and the energy intervals separating programming states may be varied for a given volume of phase change material to accommodate different multiplicative factors. By altering the programming strategy according to a range of potential multiplicative factors of interest, it is possible to determine the factors of a number using a given volume of phase change material. Factoring may thus be accomplished with a single device comprising a phase change material.

Multiple volumes of phase change material, each of which is programmed according to a different multiplicative factor, may also be used to achieve factoring. In this embodiment, a plurality of devices may be used to achieve factoring. Incrementing according to the number to be factored is effected at each of a series of devices programmed according to a different multiplicative factor. The same number of increments is applied to each device of the plurality. The incrementing may be performed one increment at a time across all devices, each device may be incremented completely with the complete incrementing continuing in succession from device to device in the series, or through a combination of incrementing across all devices and incrementing individual devices multiple times. Similarly, each individual device may have a dedicated energy source to provide incrementing energy in an amount dictated by the programming strategy of the device, a single shared energy source having the ability to provide variable amounts of energy to each of a plurality of devices as dictated by the programming strategies of each device may be used to increment, or some combination of dedicated and shared energy sources may be used. Embodiments ranging from a parallel mode of operation across all devices to sequential consideration of individual devices are possible. Through inclusion of a sufficient number of devices programmed according to the full range of potential multiplicative factors, it is possible to determine all multiplicative factors of a number. In a preferred embodiment, devices programmed according to prime factors are included and used to determine the prime factors of a numbers.

EXAMPLE 1

In this example, the method of factoring described hereinabove is used to test whether the number 4 is a factor of the number 32. The number to be factored is thus 32 and the potential multiplicative factor is 4. Implementation of the method begins with establishing programming states according to the potential multiplicative factor. In this example, the programming strategy entails establishing programming states of a phase change material in such a way that 4 increments transform the phase change material from its reset state to its set state. One way to achieve the programming strategy is to let the set state be the programming state corresponding to four increments, the reset state be the programming state corresponding to zero increments, and to choose three intermediate states between the reset state and set state as the programming states corresponding to one, two and three increments. The three intermediate states may be positioned anywhere along the high resistance plateau of the electrical response curve of a phase change material. In a preferred embodiment, the three intermediate programming states are selected so that the increment interval between consecutive programming states is uniform. This embodiment is preferred because the energy source that provides the energy used to increment from one programming state to the next need only provide energy in constant amounts. If energy is provided in the form of energy pulses, for example, incrementing pulses of constant energy may be applied to transform a phase change material from one programming state to the next. Non-uniform increment intervals fall within the scope of the instant invention, but are less preferred because the energy provided by the energy source may need to vary during incrementing.

Figure 2:
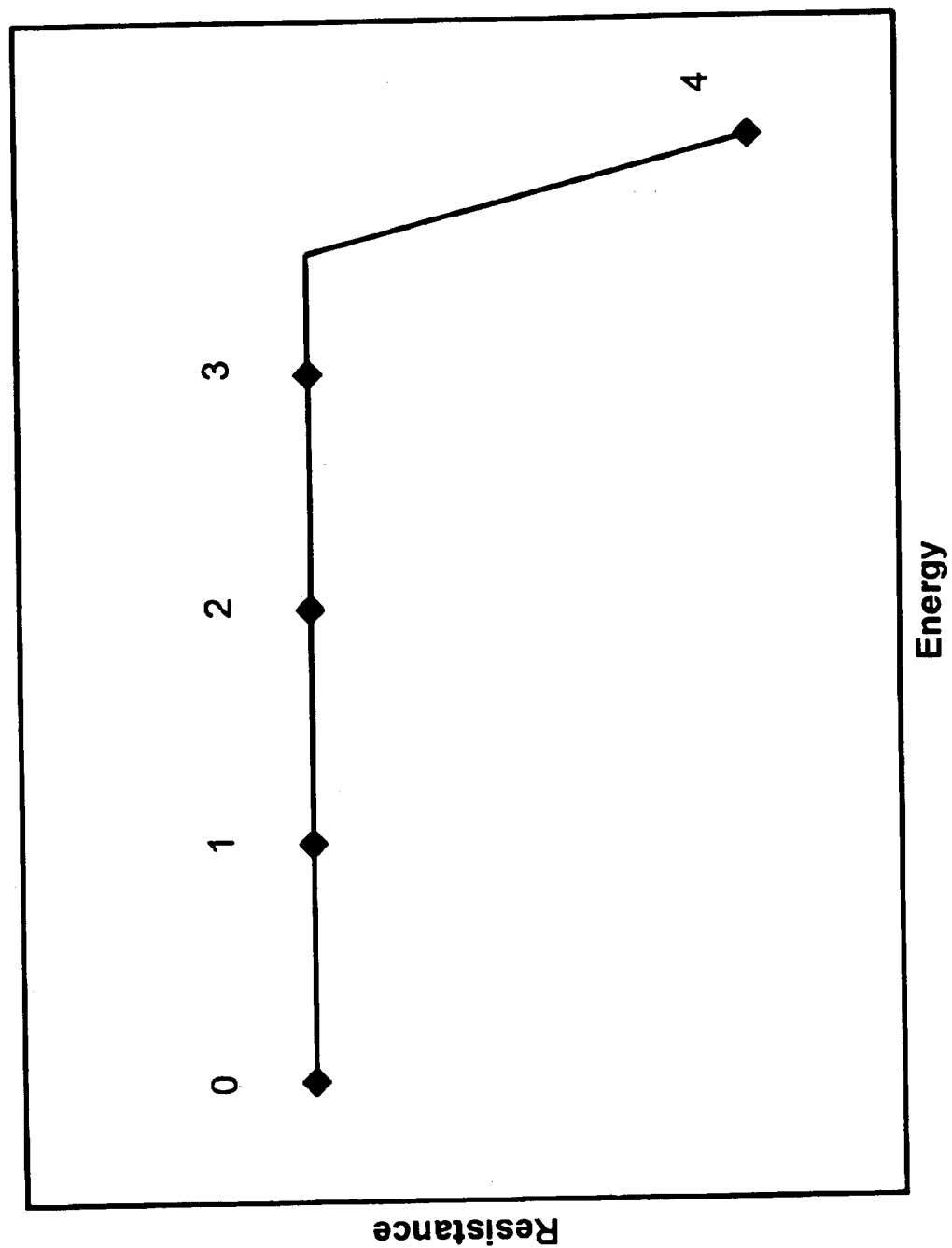
FIG. 2 is a portion of an electrical resistance plot of a phase change material used to test whether the number 4 is a multiplicative factor of an input number as described in EXAMPLE 1 herein. The electrical resistance along the pre-setting high resistance plateau and at the set state is depicted. The five programming states are labeled and depicted with symbols.

FIG. 2 herein depicts one programming strategy in the context of the present example. The figure shows a portion of the electrical response curve of a phase change material that includes the high resistance plateau and the steep decrease in resistance associated with the setting transformation. The embodiment of FIG. 2 shows programming states separated by uniform energy intervals so that the incrementing energy from one programming state to the next is constant. The programming states are labeled with consecutive integers beginning with zero, where the state labeled 0 is the reset state, the state labeled 4 is the set state, and three intermediate states labeled 1, 2, and 3 are shown. The labels of the programming states may also be viewed as integer data values that are assigned to or associated with the programming states. Within the context of the programming strategy of this example, four increments of energy are required to transform the phase change material from its reset state to its set state.

To determine whether 4 is a factor of 32, a phase change material having programming states such as those defined in FIG. 2 herein is transformed to its reset state and incremented 32 times while providing for a resetting of the phase change material each time it sets. Providing one increment energy transforms the phase change material from programming state 0 to programming state 1. A second increment transforms the phase change material to programming state 2 etc. Incrementing a phase change material in programming state 3 causes the phase change material to set to programming state 4. The setting of a phase change material may be detected by measuring the electrical resistance or some other property characteristic of the set state. Electrical resistance is a preferred measurement because it is convenient and readily permits identification of the set state. Electrical resistance may be measured after each incrementing of the phase change material. Upon detection of the set state, a phase change material is reset before further incrementing is commenced. In this example, the fifth increment of energy is added to the reset state to transform the phase change material from programming state 0 to programming state 1 and further incrementing, while resetting as necessary, commences.

Upon incrementing 32 times, the state of the phase change material is assessed. If the phase change material is in its set state, the potential multiplicative factor is indeed a factor. In this example, the phase change material is in its set state upon incrementing 32 times and it is concluded that 4 is a multiplicative factor of 32. By counting the number of times that a phase change material sets, the co-factor may also be determined. In this example, the phase change material set 8 times. The co-factor of 4 is thus seen to be 8 in this example.

In one implementation of the method of the preceding EXAMPLE 1, $Ge_2Sb_2Te_5$ was used as the phase change material and incrementing energy in the form of electrical energy pulses was used. Electrical energy pulses may be characterized by a pulse voltage or pulse duration. The pulse voltage may also be referred to as a pulse height or pulse amplitude and the pulse duration may also be referred to as a pulse width. At a pulse voltage of 1.5 V, the phase change material may be transformed from its reset state to its set state upon applying a pulse having a duration of 320 ns. Since five programming states (4 programming intervals) are used to test the potential multiplicative factor 4 and since the programming states were selected to be uniformly separated, programming states separated by an energy corresponding to the energy of a 1.5 V pulse applied for 80 ns were selected. Application of a 1.5 V, 80 ns pulse provides energy sufficient to transform the phase change material from one programming state to the next. Application of a 1.5 V, 80 ns pulse to programming state 0, for example, transforms the phase change material to programming state 1 etc.

EXAMPLE 2

In this example, a determination of whether 7 is a factor of 27 is made. This example may be completed in a manner analogous to EXAMPLE 1 described hereinabove. In this example, the number to be factored is 27 and the potential multiplicative factor is 7. Hence a phase change material must be programmed according to the potential multiplicative factor 7 in order to determine whether 7 is a factor of 27. A suitable programming strategy is to define programming states in such a way that seven increments are needed to transform the phase change from its reset state to its set state. The reset state may be selected as programming state 0 and the set state as programming state 7 with six intermediate programming states labeled 1, 2, 3, 4, 5, and 6. The higher number of programming states in EXAMPLE 2 relative to EXAMPLE 1 implies, for a particular phase change material, that the average energy interval between programming states is smaller in EXAMPLE 2 than in EXAMPLE 1. The appropriate incrementing interval or intervals may be achieved by adjusting the energy provided by an energy source to match the desired energy intervals separating the selected programming states. In the case of an energy source providing energy in the form of electric current or voltage pulses, for example, the energy content per pulse may be varied by adjusting the pulse height and/or duration.

After establishing the programming states according to the potential multiplicative factor 7, incrementing according to the number to be factored may begin. In this example, 27 increments of the phase change material are required. The phase change material is reset. Incrementing the phase change material 7 times transforms the phase change material to its set state, upon which the phase change material is reset, with further incrementing and resetting occurring as necessary until 27 increments have been provided. In this example, the phase change material is in its set state after 21 increments and is then reset a third time since initiating incrementing. An additional six incrementing pulses transform the phase change material to programming state 6. A test of the resistance of the phase change material after 27 increments thus reveals that the phase change material is not in its set state and the conclusion follows that 7 is not a factor of 27. If integer values are associated with the programming states such that programming state 1 corresponds to the number 1 etc., it further follows that 6 is the remainder that results when 27 is divided by 7. A further discussion of remainders is presented in the discussion of the instant methods of modular arithmetic described hereinbelow.

EXAMPLE 3

In this example, multiple volumes of a phase change material are used to test a plurality of potential multiplicative factors. Each volume of a phase change material may be viewed as the computing medium of a device programmed according to a different potential multiplicative factor. By incrementing each such device according to the number to be factored, it is possible to determine which of a plurality of potential multiplicative factors are truly multiplicative factors. By way of illustration, a determination of the multiplicative factors of 12 may be made.

In one embodiment, the multiplicative factors of 12 may be determined by including devices programmed according to potential multiplicative factors having values of 12 or less. In this embodiment, twelve devices programmed according to the numbers 1–12 are utilized and each of the devices is incremented 12 times. As described hereinabove, a device or volume of phase change material programmed according to a number, say X, requires X increments to be transformed from its reset state to its set state. During incrementing, each device is reset each time it reaches its set state prior to further incrementing as described hereinabove. Those devices found to be in the set state upon completion of incrementing, correspond to numbers that are true multiplicative factors of 12. In this example, it is readily apparent that devices programmed according to 1, 2, 3, 4, 6, and 12 are in their set state at the conclusion of incrementing and are therefore multiplicative factors of 12. The number of times each of the devices programmed according to a multiplicative factor is set during incrementing may also be counted to permit determination of the co-factor associated with each multiplicative factor. Devices programmed according to 5, 7, 8, 9, 10, and 11 are in a state other than the set state upon conclusion of incrementing and are therefore determined not to be multiplicative factors of 12.

Each device within the plurality of devices included in this example may be incremented completely on an individual basis before the next device is incremented (serial mode), one increment may be applied to all devices before providing further increments to any one device (parallel mode), or some combination of serial and parallel modes may be used in incrementing. A separate dedicated energy source may be used for each device and configured to provide the incrementing energy dictated by the programming strategy of the device, a single energy source capable of providing variable incrementing energies, or a combination of dedicated and variable energy sources may be used.

If the same phase change material is used for each of a plurality of devices, the energy interval separating uniform programming states will differ for devices programmed according to different potential multiplicative factors. A device programmed according to the number 9, for example, will have smaller uniform energy intervals between programming states than a device programmed according to the number 5. If energy is provided in the form of electrical current or voltage pulses having fixed pulse amplitude in this situation, the same number of incrementing pulses may be applied to each device where the pulse width is varied depending on the potential multiplicative factor used to establish the programming strategy of each device.

Example 3 provides one embodiment directed at identifying a set of multiplicative factors of a number and includes consideration of multiplicative factors up to and including the number to be factored. Alternative embodiments are possible. In another embodiment, it is recognized that a number is always a factor of itself, that 1 is a factor of every number, and that no other multiplicative factor of a number exceeds half of the value of the number. For the number 12, for example, the largest factor besides 12 is 6. Thus, the determination of the factors of a number may be made more efficient by considering devices programmed according to numbers beginning with 2 and ending with half of the number to be factored. In the case of odd numbers, it may be further recognized that 2 is not a factor and that the largest factor cannot exceed one third of the number to be factored. The number of devices that need to be considered may therefore be reduced in order to improve the efficiency of the factoring method.

METHODS OF FACTORING INTO PRIMES

The preceding examples and disclosure describe methods of factoring whose uses include identifying whether one number is a multiplicative factor of another number and determining a complete set, or subset thereof, of multiplicative factors of a number. The instant invention includes related methods in which devices programmed only according to prime number may be considered. From number theory, it is known that any number may be represented as a product of only prime numbers. Hence, consideration of only prime numbers as potential multiplicative factors provides a method for factoring a number into its primes. Identification of which prime numbers are factors of a number as well as the complete factorization of a number into a product including only prime numbers are possible with the instant methods of factoring into primes.

As described hereinabove, each of a plurality of potential multiplicative factors may be tested by using one device and varying its programming strategy according to different potential multiplicative factors or by using multiple devices, each of which is programmed according to a different potential multiplicative factor, or by using some combination of the preceding. In methods of factoring into primes, only devices programmed according to prime numbers are included. Except for the limitation to prime numbers, implementation of methods of factoring into primes may follow analogously to the methods of factoring described hereinabove. Since the number 1 is a factor of every number, it is not required to specifically consider it even though it may be considered to be a prime number.

EXAMPLE 4

In this example, the prime factors of the number 21 are determined using a plurality of devices, each of which comprises a phase change material programmed according to a different prime number. In this example, prime numbers not exceeding one half of the number to be factored are considered. Hence, devices programmed according to the numbers 2, 3, 5, and 7 are considered in this example. The next prime number, 11, is more than half of 21 so that it and larger prime numbers are not factors of 21.

To effect prime factoring of 21, devices programming according to the numbers 2, 3, 5, and 7 are incremented 21 times and reset as necessary during incrementing. Those devices present in their set state upon completion of incrementing correspond to prime factors of 21. Execution of the incrementing in this example reveals that devices according to 3 and 7 are in their set state upon conclusion of incrementing while devices programmed according to 2 and 5 are not in their set state. Hence, it is concluded that 3 and 7 are prime factors of 21.

If a prime number itself were analyzed according to the embodiment of EXAMPLE 4, no devices would be in their set state upon conclusion of incrementing. Such an outcome leads to the conclusion that the original number is a prime number or the equivalent conclusion that the number has only itself and 1 as factors. If 13 is the number for which prime factoring is desired and the procedure described in EXAMPLE 4 hereinabove were employed, devices programmed according to 2, 3 and 5 would be incremented 13 times and none of the devices would be in its set state upon conclusion of incrementing. The outcome that 13 has only itself and 1 as factors would also be reached if devices programmed according to prime numbers up to 13 were used in the method.

As described hereinabove, the co-factor of each prime factor may be determined by counting the number of times the device or volume of phase change material programmed according to the prime factor is set during incrementing. The product of each prime factor and its co-factor is equal to the original number for which prime factoring was desired. Even when devices programmed according to prime numbers are utilized, co-factors may not be prime numbers. Hence, further consideration is required to effect a complete factorization of a number into a product containing only prime numbers.

These further considerations were not necessary in EXAMPLE 4 described hereinabove because each of the identified prime factors of 21 (3 and 7) had a co-factor that was also a prime number (7 and 3, respectively). The method described in EXAMPLE 4 may be used to determine whether particular prime numbers of a number are multiplicative factors, but may not provide a complete factoring of a number into its prime factors where complete factoring refers to identification of the unique set of primes whose product is equal to the number being factored. In EXAMPLE 4, complete factoring did occur because the product of the identified prime factors (3 times 7) equals the number being factored (21).

The complete factoring into primes of a number such as 18 illustrates the desire to include considerations beyond those indicated in EXAMPLE 4. The factoring of 18 using devices programmed according to prime numbers in the framework of EXAMPLE 4 requires inclusion of devices or volumes of phase change material programmed according to the prime numbers 2, 3, 5, and 7. Upon completing incrementing of each of the devices according to the number 18, it is found that only 2 and 3 are prime factors of 18. Since 2*3 does not equal 18, the outcome in this situation does not constitute a complete factoring of 18 into its primes. (For convenience, the notation * shall be used herein to denote the mathematical operation of multiplication. The product of 2 and 3, for example, may be expressed 2*3 where 2*3 implies 2 times 3.) Instead, the conclusion follows that the only prime factors of 18 are 2 and 3, but that one or both of the factors 2 and 3 must appear more than one time in the complete prime factoring of 18. Thus, the complete prime factoring of a number includes identification of all prime factors as well as the number of occurrences of each prime factor in the product of primes equal to the number for which prime factorization is sought.

Complete prime factoring requires further consideration of the co-factors obtained upon the initial factoring according to prime numbers. In the case of 18, the prime factors 2 and 3 are identified and have co-factors 9 and 6, respectively. As indicated hereinabove, the co-factors may be determined by counting the number of setting transformations that occur for the devices programmed according to the identified prime factors. Since the co-factors are not prime numbers, it is evident that the complete prime factoring of 18 has not been achieved in the initial consideration of prime numbers. A secondary determination of the prime factors of the co-factors obtained for the initially identified prime factors is needed. Since 2*9 and 3*6 both equal 18, a secondary determination of prime factors may be made with respect to either of the co-factors 9 and 6.

The secondary determination is simplified by the knowledge that the initial consideration has identified all prime factors present in the number being factored into primes. Thus, the co-factors may be factored with devices programming according to the prime factors that have been identified. In the case of 18, the co-factor 9 or the co-factor 6 may be selected for further consideration and this further consideration need only include devices programmed according to the identified prime factors 2 and 3. If the co-factor 9 is selected and tested as described hereinabove with respect to devices programmed according to 2 and 3, it is found that 2 is not a prime factor while 3 is a prime factor with a co-factor of 3. Since the co-factor 3 is a prime number, factorization of 18 into primes is complete with the result 18=2*3*3. In this result, 2 is a prime factor identified in the initial determination of prime factors, 3 is a prime factor identified in the secondary determination of prime factors and 3 is a co-factor identified in the secondary determination of prime factors. The prime number 3 is thus seen to be present twice in the prime factorization of 18.

Several determinations of the prime factors of co-factors may be executed consecutively to effect the complete prime factorization of any input number. Prime factoring may be viewed as a cascading determination of prime factors of successively smaller numbers. The prime factors of an input number are determined in the initial consideration or level of factoring, a co-factor of one of the prime factors identified in the initial consideration is used in the next consideration etc. until a co-factor that is prime is found. Each level of consideration thus involves analysis of a smaller number than the preceding level of consideration in the cascading scheme. Each level of determination may be completed with any co-factor found in the preceding determination. At the level in which the co-factor is found to be a prime number, complete prime factorization has been achieved. In the case of the number 18, two levels of consideration were involved. In the first level of consideration, the numbers 2 and 3 were identified as prime factors and in the second level the co-factor 9 was further considered and found to include a prime factor 3 having a co-factor 3. Since the co-factor 3 is a prime number, only two levels of consideration are needed for the number 18. More complicated cases may be analyzed analogously.

An alternative method of completing prime factorization is to compare the product of the prime factors obtained after one level of consideration with the input number to see if they are equal. The co-pending parent application U.S. Ser. No. 10/144,319, for example, describes methods of multiplication using a phase change material. If the product of prime factors obtained after one level of consideration is equal to the input number, complete prime factorization has been achieved. If not, further consideration is needed. Further consideration may include another level of consideration of prime factors as described hereinabove or may include a division of the input number by the product of prime factors obtained after the initial level of consideration. Methods of dividing using a phase change material are disclosed, for example, in the co-pending parent application U.S. Ser. No. 10/144,319. If the result of the division is a prime number, prime factorization has been achieved. If not, the result of the division is further considered by factoring or division until prime factorization has been achieved. This alternative method may also be used for general factoring of numbers into factors that include non-prime numbers.

To illustrate the foregoing, the example of the prime factoring of the number 18 may be considered. As indicated hereinabove, after one level of factoring, 2 and 3 are identified as prime factors of 18. Multiplication of 2 and 3 yields 6. Since 6 is not equal to 18, further consideration is needed to complete prime factoring. According to the foregoing division method, the original number 18 is divided by 6 to obtain 3. The outcome of the division is thus that 3 is another factor of 18. Since 3 is a prime number, the one implementation of the division method completes the prime factoring with the result that 18 may be prime factored into 2*3*3.

In the methods of factoring and methods of prime factoring disclosed herein, it is frequently desired to determine the co-factor of a factor or prime factor. As indicated hereinabove, a co-factor of a factor may be determined by counting the number of times a volume of phase change material programmed according to the factor is set during incrementing according to the input number. The counting of setting transformations may be completed with an external counter or by incrementing a counting register by one each time the phase change material sets. Counting registers comprising a phase change material are described in the co-pending parent application U.S. Ser. No. 10/144,319. A counting register may have the same or a different number of programming states as the volume of phase change material used as a computing medium by the instant methods. In the factoring of some numbers, the co-factor may be a large number and may exceed the number of programming states available to a counting register. One way to account for such co-factors is to use multiple counting registers where each of several register may be used to store one digit of a multidigit co-factor. The storing of multidigit numbers has been described in the co-pending parent application U.S. Ser. No. 10/144,319.

METHODS OF MODULAR ARITHMETIC

In an example such as EXAMPLE 2 described hereinabove where a potential multiplicative factor is determined not to be a factor, the outcome of the factoring method may still be interpretatively useful. The branch of mathematics known as modular arithmetic includes consideration of the remainders that result upon division of one number by another number. As described hereinabove, when the remainder is zero, factoring is accomplished. Non-zero remainders are not indicative of factoring, but are important in modular arithmetic computations. Modular arithmetic is described in many textbooks of mathematics and is described in part hereinbelow in order to provide background information and context for the disclosed methods of modular arithmetic.

The remainder is a key quantity in modular arithmetic. As used herein, a remainder refers to the number that remains when one number is divided by another number. When 19 is divided by 7, for example, a remainder of 5 is obtained. When 34 is divided by 9, for example, a remainder of 7 is obtained. A general result from number theory, known as the division algorithm, provides for a remainder whenever an integer is divided by another integer. According to the division algorithm, an arbitrary integer $a$ (the dividend) may be expressed in terms of an integer $b$ (the divisor) according to $a=q*b+r$ where $q$ is an integer (the quotient) and $r$ is a non-negative integer having a value less than the magnitude of the divisor $b$. According to number theory, the values of $q$ and $r$ are unique for a given dividend and divisor.

In modular arithmetic, integers are represented by their remainder with respect to the modulus of the arithmetic system. The modulus is akin to the divisor in a division context. The remainders with respect to division by 7, for example, may be used to define an arithmetic system having a modulus equal to 7. Such an arithmetic system may also be referred to as a modulo 7 system. In a modulo 7 system, integers are represented by their remainder with respect to division by 7. In the preceding example where 19 is divided by 7, a remainder of 5 was determined. In a modulo 7 system, therefore, the number 19 is represented by its remainder of 5. This result may also be expressed in the form of a congruence relation: $19 \equiv 5 \mod 7$ where the mathematical symbol $\equiv$ denotes congruence. Similar considerations apply to arithmetic systems having any modulus and a general congruence relation of the form $a \equiv r \mod m$ may be written where $m$ is the modulus, $a$ is an integer, and $r$ is the remainder that results when $a$ is divided by $m$. The remainder $r$ may also be referred to as the congruence of the integer $a$ in a modulo $m$ system. The remainder $r$ may also be viewed as the remainder resulting when the dividend $a$ is divided by the divisor $m$.

In a modulo $m$ system, the remainder $r$ has an integer values ranging from 0 to $m-1$ and all integers $a$ must have one of the permitted values of $r$. In a modulo 5 system, for example, $r$ may be 0, 1, 2, 3, or 4 and all integer values $a$ have remainders $r$ selected from 0, 1, 2, 3, or 4. Examples of congruence relations in modulo 5 include: $19 \equiv 4 \mod 5$, $22 \equiv 2 \mod 5$, $46 \equiv 1 \mod 5$ etc. A given value of the remainder $r$ is necessarily associated with several values of the integer $a$. Thus, for example, $19 \equiv 4 \mod 5$, $54 \equiv 4 \mod 5$, $799 \equiv 4 \mod 5$, etc. Integers having the same remainder $b$ in a modulo $m$ arithmetic system may be referred to as being in the same equivalence class or residue class. 19, 54, and 799, for example, are in the same equivalence class in a modulo 5 system. A complete equivalence class includes all integers having the same remainder in a particular modulo system. The number of different equivalence classes in a modulo $m$ system is $m$. A modulo 3 system, for example, has 3 equivalence classes defined by the 3 possible remainder values 0, 1, and 2.

Determination of the remainder $r$ is one of the basic computations in modular arithmetic. As exemplified in EXAMPLE 2 described hereinabove, a multistate computing medium may be used to provide remainders. As described hereinabove, phase change materials are the preferred multistate computing medium in the context of the instant methods. If, upon conclusion of incrementing during implementation of one of the factoring methods described hereinabove, a phase change material is not in its set state, it is known that the number according to which the phase change material was programmed is not a factor of the original input number. By reading the phase change material to determine in which programming state it is in upon completion of incrementing, a remainder may be determined. An illustrative example of a method for determining the congruence of an input number in a modular arithmetic system is provided in the following EXAMPLE 5.

EXAMPLE 5

In this example, the congruence of 16 in a modulo 6 system is determined. This computation may also be referred to as a congruence computation. In this congruence computation, the quantity $r$ in the congruence relation $16 \equiv r \mod 6$ is sought. To complete the congruence determination, a phase change material is programmed according to the modulus 6. As described hereinabove, the programming is accomplished through a strategy in which programming states are defined such that six increments are required to transform the phase change material from its reset state to its set state. The reset state may be associated with zero increments, the set state with six increments and additional states may be defined along the high resistance plateau that correspond to 1, 2, 3, 4, and 5 increments. The energy separation between states may be uniform or non-uniform. A phase change material so programmed may be referred to as a modulo 6 phase change material.

For the purposes of modular arithmetic, integer values may be associated with the programming states to facilitate interpretation of the state of the phase change material. The reset state may be associated with the value zero, the programming state corresponding to one increment may be associated with the value one, etc. Since a modulo 6 system provides for remainders of 5 or less, the set state (the programming state corresponding to 6 increments in this example) is properly associated with the value zero. (If the set state were associated with 6, the significance of a phase change material in the set state may be interpreted as 6 mod 6. Since zero is congruent to 6 mod 6, no conflict arises by associating the value zero to the set state. This association is also consistent with use of the set state as a criterion for factoring as described hereinabove.)

Once programmed according to the desired modulus, the phase change material may be used to determine any congruence relationship within the programmed modulus. In this example, the congruence of 16 in the modulo 6 system is to be determined. The determination proceeds by incrementing the phase change material according to the number for which the congruence relation is sought. In this example, 16 increments are provided to the phase change material and the phase change material is reset each time it is transformed to its set state. The phase change material is transformed to its reset state, if necessary, prior to incrementing. As described hereinabove, the electrical resistance of the phase change material may be measured during incrementing to assess when the phase change material is transformed to its set state. Application of six increments of energy in this example transforms the phase change material from its reset state to its set state at which point the phase change material is reset before further incrementing. Application of increments 7 through 12 transforms the phase change material to its set state for the second time in this example. The phase change material is once again reset and the final four of the required 16 increments are provided to the phase change material. Increment 13 transforms the phase change material to the programming state associated with the value 1, increment 14 transforms the phase change material to the programming state associated with the value 2, increment 15 transforms the phase change material to the programming state associated with the value 3 and increment 16 transforms the phase change material to the programming state associated with the value 4. Hence, upon conclusion of the required 16 increments, the phase change material is in the programming state associated with the value 4. This final programming state provides the desired remainder or congruence and the conclusion follows that the congruence relation sought in this example is 16≡4 mod 6.

Computation of a congruence relation as in EXAMPLE 5 requires a determination of the programming state in which the phase change material is upon completion of incrementing. This final programming state may be determined by reading the phase change material. If the phase change material is in its set state upon conclusion of incrementing, reading may be accomplished by measuring the electrical resistance. In this case, the remainder is zero and the congruence relation is completed by letting r equal zero. This case corresponds to the case where the modulus m is a multiplicative factor of a.

When the modulus m is not a multiplicative factor of a, the phase change material is in a final programming state other than its set state upon conclusion of incrementing. This final programming state may be determined by reading the phase change material. Reading has been described in the co-pending parent application U.S. Ser. No. 10/144,319 and requires incrementing of the phase change material from the final programming state achieved during implementation of the congruence computation. The final programming state may be determined by: 1. incrementing until the phase change material sets; 2. counting the required number of increments; and 3. subtracting the number of required increments from the modulus of the computation. In EXAMPLE 5 described hereinabove, for example, 2 increments are required to transform the phase change material from its final programming state to its set state. Subtraction of 2 from the modulus 6 gives 4. Hence, it is concluded that the final programming state is the programming state associated with the number 4 and that 4 is the remainder sought in the congruence computation of EXAMPLE 5. In one embodiment described in the co-pending parent application U.S. Ser. No. 10/144,319, the counting included in step 2 may be achieved by incrementing a counting register once for each increment of energy provided to the final programming state of the phase change material. In this embodiment, the difference represented by the subtraction of step 3 corresponds to the number of increments required to set the counting register provided that the counting register has the same number of programming states as the phase change material used in the congruence computation. In a preferred embodiment, the counting register is comprised of a phase change material programmed according to the modulus used in the congruence computation.

As indicated hereinabove, the congruence computation with respect to a modulus m separates the set of all integers into congruence classes or residues having a common remainder with respect to division by m. In a modulo 5 system, for example, 5 residue classes corresponding to the remainders 0, 1, 2, 3, and 4 exist and every integer is included in one and only one of these residue classes. The residue class 2, for example, includes as members 2, 7, 12, 17, . . . ; the residue class 3 includes as members 3, 8, 13, 18, . . . etc. Application of the instant method for determining the congruence of an input number in a modular arithmetic system to each of several input numbers may be used to classify a set of numbers into residue classes.

Addition in a modular arithmetic system may also be completed using a phase change material according to the instant invention. Modular arithmetic systems are closed with respect to addition so that addition of one element of a modular arithmetic system to another element of a modular arithmetic system necessarily provides a result that is also a member of the modular arithmetic system. As an example, we may consider the modulo 5 system mentioned above. The modulo 5 system has as members the numbers 0, 1, 2, 3, and 4. As described hereinabove, these numbers may be viewed as the possible remainders or residue classes present in a modulo 5 arithmetic system. Addition in modular arithmetic is completed in a way similar to ordinary decimal addition, with the exception that the outcome be restricted to a member of the modular arithmetic system. The addition of 1 in a modulo 5 system to 2 in a modulo 5 system is equal to 3 in a modulo 5 system. This addition may be expressed 1 mod 5+2 mod 5=3 mod 5.

Special consideration is needed when the sum of two members of a modular arithmetic system equals or exceeds the modulus of the modular arithmetic system. In a modulo 5 system, for example, the addition of 3 and 4 requires appropriate treatment since the result expected in ordinary decimal arithmetic, 7, exceeds the modulus 5 of the modular arithmetic system. These cases may be properly treated by converting the expected decimal result to its modulo 5 equivalent. Hence, 3 mod 5+4 mod 5=7 mod 5=2 mod 5. The outcome 2 is a member of the modulo 5 arithmetic system and is therefore a proper result. Addition of decimal numbers in general in the framework of a modular arithmetic system may be similarly completed by converting decimal numbers to their modulo equivalents and adding. As an example, we may add 19 and 37 in a modulo 5 system as follows 19 mod 5+37. mod 5=4 mod 5+2 mod 5=6 mod 5=1 mod 5. The computation may also be completed by first adding the decimal numbers and then converting the result to its modulo 5 equivalent: 19 mod 5+37 mod 5=56 mod 5=1 mod 5.

Addition in a modular arithmetic system may be readily achieved in the instant invention by programming a phase change material according to the modulus of the modular arithmetic system, resetting the phase change material, and incrementing it according to the numbers being summed. In the preceding example in which 19 and 37 are added in a modulo 5 arithmetic system, for example, we may begin by programming a phase change material according to the modulus 5. As described hereinabove, this programming includes defining programming states such that 5 increments are required to transform the phase change material from its reset state to its set state. Thus, a total of 6 programming states is defined where the reset state, set state and 4 intermediate states are included. The phase change material is reset and addition is accomplished by incrementing according to each of the two numbers being summed and resetting as necessary as described hereinabove each time the phase change material is transformed to its set state. In this example, the phase change material is first incremented 19 times to provide a phase change material programming state 5 (the programming state corresponding to the number 4) and then further incremented 37 times to provide a final state in which the phase change material is in programming state 2 (the programming state corresponding to the number 1).

Addition in a modular arithmetic system may also be viewed in terms of residue classes since it is the remainders that ultimately determine the sum of two numbers in modular arithmetic. In one example described hereinabove, we found that 1 mod 5+2 mod 5=3 mod 5. This result may also be interpreted in terms of residue classes as follows: the sum of any number in residue class 1 with any number in residue class 2 necessarily produces a number in residue class 3 in a modulo 5 system. As an example, 16 is in residue class 1, 32 is in residue class 2 and the sum 16+32=48 is in residue class 3. Addition may be similarly interpreted for other residue classes and in other modular arithmetic systems.

The disclosure set forth herein is illustrative and not intended to limit the practice of the instant invention. Numerous equivalents and trivial variations thereof are envisioned to be within the scope of the instant invention. It is the following claims, including all equivalents, in combination with the foregoing disclosure, which define the scope of the instant invention.

We claim:

1. A method of addition in a modular arithmetic system, said method comprising the steps of:
   providing a first number;
   providing a second number;
   providing a volume of phase change material, said phase change material having a plurality of states, said states including: a reset state, a set state obtainable from said reset state by applying energy in an amount corresponding to the set energy of said reset state, said set state having lower resistance than said reset state, and one or more intermediate states having substantially the same resistance as said reset state, said one or more intermediate states being obtainable from said reset state by applying energy in an amount less than said set energy of said reset state;
   applying a first set of energy pulses to said phase change material, the number of applied energy pulses in said first set equaling said first number; and
   applying a second set of energy pulses to said phase change material, the number of applied energy pulses in said second set equaling said second number.

2. The method of claim 1, wherein said phase change material comprises a chalcogen.

3. The method of claim 2, wherein said phase change material further comprises Ge.

4. The method of claim 2, wherein said phase change material further comprises Sb.

5. The method of claim 2, wherein said phase change material further comprises a transition metal element.

6. The method of claim 2, wherein said phase change material further comprises In, Ag, Bi, Pb, Sn, As, or P.

7. The method of claim 1, wherein said phase change material comprises Te.

8. The method of claim 1, wherein said phase change material comprises Te and Se.

9. The method of claim 1, wherein the resistance of said set state is at least a factor of ten lower than the resistance of said reset state.

10. The method of claim 1, wherein said first and second sets of applied energy pulses include electrical or optical energy pulses.

11. The method of claim 1, wherein the energy of at least one of said applied energy pulses in said first set or said second set of energy pulses is less than said set energy of said reset state.

12. The method of claim 1, wherein the energy of each of said applied energy pulses in said first set or said second set of energy pulses is less than said set energy of said reset state.

13. The method of claim 1, wherein said energy pulses of said first set of applied energy pulses are equal in energy.

14. The method of claim 13, wherein said energy pulses of said second set of applied energy pulses are equal in energy.

15. The method of claim 1, wherein said energy pulses of said first set of applied energy pulses are equal in amplitude.

16. The method of claim 1, further comprising the step of resetting said phase change material, said resetting step occurring prior to said applying first set of energy pulses step.

17. The method of claim 1, further comprising the step of resetting said phase change material each time it sets during said applying first set of energy pulses step.

18. The method of claim 1, further comprising the step of resetting said phase change material each time it sets during said applying second set of energy pulses step.

19. The method of claim 1, further comprising the step of measuring the resistance of said phase change material.

20. The method of claim 1, further comprising the step of setting said phase change material, said setting step occurring after said applying second set of energy pulses step.

21. The method of claim 1, further comprising the steps of
   providing the modulus of a modular arithmetic system;
   programming said phase change material according to said modulus, said programming including defining programming states, said programming states being selected from said plurality of states of said phase change material, said programming states including said reset state and said set state, the number of said programming states being one more than said modulus.

22. The method of claim 21, wherein each of said energy pulses applied during said applying first set of energy pulses step or said applying second set of energy pulses step transforms said phase change material from one of said programming states to another of said programming states.

23. The method of claim 21, wherein said applying first set of energy pulses step or said applying second set of energy pulses step comprises the steps of:
   transforming said phase change material to said reset state;
   A. incrementing said phase change material, said incrementing including providing an energy pulse having sufficient energy to transform said phase change material to a different one of said programming states;

B. iteratively repeating said incrementing step A until said phase change material is transformed to said set state;

C. resetting said phase change material and

D. iteratively repeating the above steps A, B, and C until all of said energy pulses of said first set of energy pulses or said second set of energy pulses have been applied.

24. The method of claim 23, further comprising the step of setting said phase change material, said setting step occurring after said applying second set of energy pulses step, said setting step including the steps of E. incrementing said phase change material, said incrementing including providing an energy pulse having sufficient energy to transform said phase change material to a different one of said programming states;

F. iteratively repeating said incrementing step E until said phase change material is transformed to said set state.

25. The method of claim 24, further comprising the step of counting the number of increments required to transform said phase change material to said set state.

* * * * *